United States Patent
Robertson et al.

(10) Patent No.: US 11,899,066 B2
(45) Date of Patent: Feb. 13, 2024

(54) CONFIGURATION OF CONFIGURABLE TEST LOGIC

(71) Applicant: HEWLETT PACKARD ENTERPRISE DEVELOPMENT LP, Houston, TX (US)

(72) Inventors: Naysen J. Robertson, Orangevale, CA (US); Christopher M. Wesneski, The Colony, TX (US); Samuel Gonzalez, Tomball, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 33 days.

(21) Appl. No.: 17/812,937

(22) Filed: Jul. 15, 2022

(65) Prior Publication Data

US 2024/0019490 A1   Jan. 18, 2024

(51) Int. Cl.
*G01R 31/3185* (2006.01)
*G06F 30/34* (2020.01)
*G01R 31/317* (2006.01)

(52) U.S. Cl.
CPC ......... *G01R 31/3185* (2013.01); *G06F 30/34* (2020.01); *G01R 31/31727* (2013.01)

(58) Field of Classification Search
CPC .......... G01R 31/3185; G01R 31/31727; G06F 30/34; G06F 30/31; G06F 30/343; G06F 30/347; G06F 2111/00; G06F 2119/22
See application file for complete search history.

(56) References Cited

U.S. PATENT DOCUMENTS

| | | |
|---|---|---|
| 6,823,497 B2 | 11/2004 | Schubert et al. |
| 7,065,481 B2 | 6/2006 | Schubert et al. |
| 7,240,303 B1 | 7/2007 | Schubert et al. |
| 7,412,624 B1 | 8/2008 | Draper |
| 7,539,900 B1 | 5/2009 | Plofsky |
| 7,685,483 B1 | 3/2010 | White et al. |
| 7,827,510 B1 | 11/2010 | Schubert et al. |

(Continued)

OTHER PUBLICATIONS

I. Ahmed, K. Nouh and A. Abbas, "Multiple reset domains verification using assertion based verification," 2017 IFIP/IEEE International Conference on Very Large Scale Integration (VLSI-SoC), Abu Dhabi, United Arab Emirates, 2017, pp. 1-6, (Year: 2017).*

(Continued)

*Primary Examiner* — Cynthia Britt
(74) *Attorney, Agent, or Firm* — Trop, Pruner & Hu, P.C.

(57) ABSTRACT

In some examples, a computing device includes a first reset domain including a test controller and a configurable test logic. The computing device includes a second reset domain including a subsystem to be measured by the configurable test logic. The first reset domain is to enter a reset mode, and after exiting the reset mode, receive configuration information that configures the configurable test logic. The test controller of the first reset domain is to maintain the second reset domain in a reset mode after the first reset domain has exited the reset mode of the first reset domain, and responsive to the received configuration information for configuring the configurable test logic, provide a reset release indication to the second reset domain to allow the second reset domain to exit the reset mode of the second reset domain.

20 Claims, 5 Drawing Sheets

(56) References Cited

U.S. PATENT DOCUMENTS

| | | |
|---|---|---|
| 9,268,627 B2 | 2/2016 | Kraipak et al. |
| 10,345,377 B2 | 7/2019 | Kutz et al. |
| 2008/0010573 A1* | 1/2008 | Sul .................. G01R 31/31922 714/731 |
| 2020/0334045 A1 | 10/2020 | Chaiken et al. |
| 2022/0092244 A1* | 3/2022 | Rahim ................ G06F 30/3323 |
| 2022/0103179 A1* | 3/2022 | Flores ...................... H03K 5/00 |
| 2022/0255541 A1* | 8/2022 | Zlotnik .................. H03K 5/135 |
| 2022/0261522 A1* | 8/2022 | Cook .................... G06F 30/333 |

OTHER PUBLICATIONS

"Reset Domain Crossing Circuitry using an edge detection protocol which toggles the value of the functional flip-flop on the other reset domain" published in The IP.com Journal, Nov. 4, 2018 Disclosed Anonymously (Year: 2018).*
Electronics Notes, "JTAG Interface, TAP Test Access Port", Jul. 18, 2022, 3 pages.
Gallagher, Sam, "Introduction to JTAG and the Test Access Port (TAP)", Technical Article, Nov. 18, 2020, 6 pages.
Wikipedia, "JTAG", available online at <https://en.wikipedia.org/w/index.php?title=JTAG&oldid=1047151525>, Sep. 29, 2021, 16 pages.

* cited by examiner

CONFIGURATION OF CONFIGURABLE TEST LOGIC

BACKGROUND

A computing device can include any or some combination of the following: a computer, a smartphone, a game appliance, a vehicle controller, a communication node, a storage device, a circuit board (on which are mounted various electronic components), an electronic chip, and so forth. Examples of electronic chips can include an integrated circuit device, such as an application-specific integrated circuit (ASIC) device, a very-large-scale integration (VLSI) device, a programmable gate array (PGA), a microprocessor, a microcontroller, a digital signal processor (DSP), and so forth. A "circuit board" can include an arrangement of layers that include electrically conductive elements and insulating elements, and electronic components mounted on the external surface(s) of the circuit board and possibly embedded inside the circuit board.

BRIEF DESCRIPTION OF THE DRAWINGS

Some implementations of the present disclosure are described with respect to the following figures.

Figure 1:
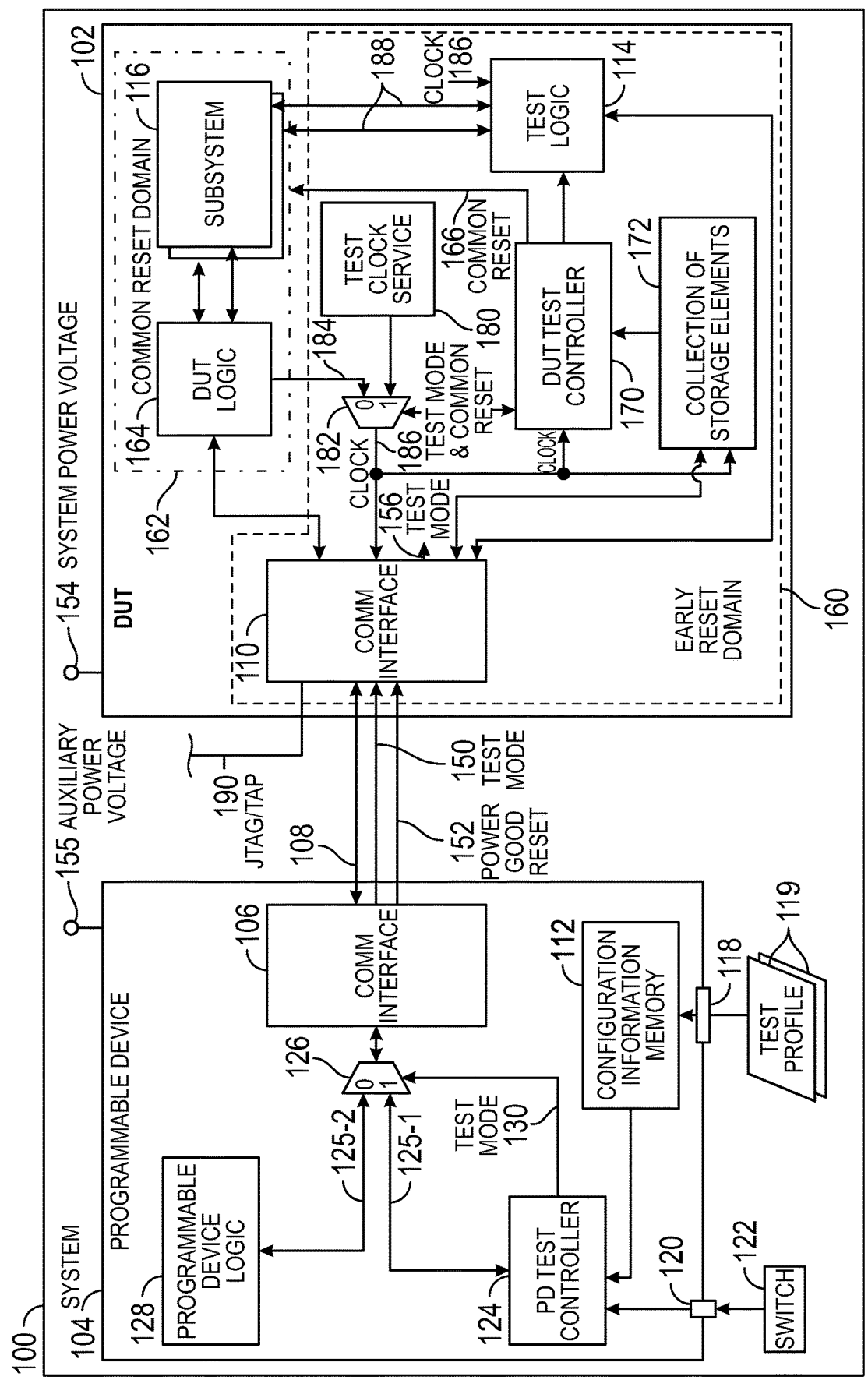
FIG. 1 is a block diagram of an arrangement that includes a device under test (DUT) and a programmable device, according to some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In some cases, a computing device can include test logic that can perform tests on the computing device. A "test" of a computing device can refer to performing any operation that involves collecting data of the computing device, and possibly initiating an action (or multiple actions) in the computing device for the purpose of detecting whether or not the computing device behaves according to a target behavior. For example, testing a computing device can refer to debugging the computing device to collect data for the purpose of identifying a cause of a bug in the computing device, where a "bug" can refer to any abnormality or unexpected behavior in the computing device.

Collecting data of the computing device can be referred to as "measuring" any portion of the computing device. For example, test logic can measure a subsystem of the computing device by monitoring a collection of signals (a single signal or multiple signals) transmitted by or received by the subsystem. Measuring the subsystem can also refer to retrieving data associated with the subsystem that has been stored in a storage medium, such as a register set (including a register or multiple registers), a memory, a disk-based storage system, a solid state drive, and so forth.

A "subsystem" of a computing device can refer to any part of the computing device that includes hardware circuitry and/or machine-readable instructions to perform respective tasks of the computing device. Examples of subsystems are discussed further below.

In some examples, the test logic in a computing device is configurable to perform different types of tests. For example, the test logic can be configured to perform measurements of different subsystems in the computing device. A first configuration of the test logic can cause the test logic to measure a first subsystem in the computing device, a second configuration can cause the test logic to measure a second subsystem of the computing device, and so forth.

In some examples, a computing device can include a Test Access Port (TAP) that can be used for performing a test of the computing device. The TAP includes an interface through which signals can be exchanged between the computing device under test and an external testing device. Testing the computing device using the TAP can be according to a Joint Test Action Group (JTAG) protocol, which is an industry standard for verifying designs and testing of computing devices.

In some examples, the TAP can be used to configure the test logic of the computing device, such as by sending configuration information to the test logic through the TAP. In some cases, configuring the test logic of a computing device through the TAP may not allow the test logic to perform test measurements and/or other test actions during a target time interval. For example, it may be desired to measure subsystem(s) of the computing device when the computing device is initially exiting reset. A computing device is "reset" when a state of the computing device is cleared to an initial condition. The computing device can be placed in reset by power cycling the computing device (powering off the computing device followed by powering on the computing device), or activating a reset signal to the computing device. A computing device "in reset" can refer to the computing device being held in a state in which the computing device is not operational (e.g., not executing machine-readable instructions and/or performing specified tasks). A computing device "exiting" reset can refer to the computing device starting to execute after being placed in the reset state.

A "state" of a computing device can be represented by context information that can be stored in various storage elements of the computing device, such as register set, a memory, and so forth. For example, when the computing device is power cycled, the computing device is initially in reset when power is turned back on to the computing device. The computing device can perform a sequence of initialization actions as part of the reset, such as by populating the various storage elements with values corresponding to an initial condition of the computing device.

Since the test logic of the computing device cannot be configured until the computing device exits reset, there may be a race condition between when the test logic is being configured through the TAP after the reset and a target operation of subsystem(s) to be measured as the subsystem(s) exit reset. As a result, once the test logic is configured after the reset, the window of opportunity to perform the measurement of the subsystem(s) may have passed.

In accordance with some implementations of the present disclosure, to perform testing of a computing device under test (referred to as a "DUT" in the ensuing discussion, including testing during a time interval soon after the DUT has exited reset, a programmable device (separate from the DUT) can be used to, prior to the DUT exiting reset: 1) detect that a test mode of the DUT has been requested, 2) obtain configuration information to perform a target test in the test mode, and 3) control the DUT to exit reset. The programmable device refers to any electronic device that can be configured to perform different requested actions at different times. For example, different configuration information (e.g., in the form of test profiles) can be provided to the programmable device to cause the programmable device to load the configuration information to the DUT for configuring the test logic of the DUT. The different configuration information can be supplied from a user or another entity (e.g., a program or a machine) to the programmable device. A test mode activation input can also be supplied to the programmable device to cause the programmable device to activate the test mode.

The programmable device can be a reprogrammable device that can be reprogrammed (i.e., reconfigured) to perform different tasks. More generally, instead of using a programmable device, a reset and power control device (such as an integrated circuit (IC) device) can be provided to perform various tasks as discussed herein. A "control device" can refer to a programmable device or another control device that is programmed (or more generally configured) once.

The DUT includes configurable test logic that can be configured using configuration information from the programmable device. The DUT has a first reset domain that includes the configurable test logic, and a collection of storage elements (e.g., a collection of registers, a collection of buffers, a memory, etc.) to receive the configuration information from the programmable device. A "collection" of storage elements can refer to a single storage element or multiple storage elements.

The DUT further has a second reset domain that includes subsystem(s) to be measured by the configurable test logic once the configurable test logic is configured with the configuration information. The second reset domain remains in reset until the configuration information has been written to the collection of storage elements such that the configurable test logic in the first reset domain is ready to be configured.

FIG. 1 is a block diagram of an example system 100 that includes a DUT 102 and a programmable device 104. More generally, each reference to "programmable device" can be replaced with a "control device" in the discussed examples. The system 100 can include a computer system, a communication system, a storage system, a vehicle, a household appliance, and so forth.

In some examples, the programmable device 104 is used to perform specified tasks of the system 100, such as to control reset sequencing (to control when components of the system 100 are powered on and are allowed to exit reset), provide management interfaces, store security profiles, and so forth. In accordance with some implementations of the present disclosure, the programmable device 104 that is already present in the system 100 can be leveraged to control the test mode of the DUT 102 to allow for testing during a target time interval, such as during a time interval following when the DUT 102 has initially exited reset. The programmable device 104 can include a programmable logic device (PLD) (e.g., a complex programmable logic device (cPLD), a field programmable gate array (FPGA), etc.), or any other type of device that can be configured (and reconfigured) to perform different tasks.

The programmable device 104 includes a communication interface 106 that allows the programmable device 104 to communicate over a communication link 108 to the DUT 102. The DUT 102 includes a communication interface 110 to communicate over the communication link 108 with the programmable device 104.

A "communication interface" can include a signal transceiver to send and receive signals over the communication link, such as clock signals, data signals, control signals, and so forth.

In some examples, the communication interfaces 106 and 108 can be an existing communication interface (e.g., having a defined set of pins or signals) that does not have to be modified (such as by adding pins or signals) to support techniques as discussed herein. For example, configuration information (e.g., in the form of test profiles) may be sent from the communication interface 106 to the communication interface 106 using a protocol and/or a communication rate that is different from data sent during an operational mode of the programmable device 104, but that uses the same set of pins or signals. The "operational mode" of the programmable device 104 is explained further below.

In accordance with some implementations of the present disclosure, the programmable device 104 includes a configuration information memory 112 that can be used for storing configuration information for configuring test logic 114 in the DUT 102. The configuration information memory 112 can include a collection of memory devices (a single memory device or multiple memory devices). Examples of memory devices include flash memory devices (e.g., NOR flash memory devices, etc.), dynamic random access memory (DRAM) devices, static random access memory (SRAM) devices, and so forth.

The test logic 114 can be implemented using hardware processing circuitry (e.g., circuitry of an ASIC, a VLSI, a PGA, etc.) or a combination of hardware processing circuitry and machine-readable instructions. In some examples, the test logic 114 can include multiple test logic blocks. A test logic block can refer to a portion of the test logic 114 that is to perform a respective test action. Different test logic blocks can perform different test actions, in some examples.

For example, a first test logic block can collect data of a first subsystem in the DUT 102, a second test logic block can collect data of a second subsystem in the DUT 102, and so forth. Various subsystems 116 are part of the DUT 102. Different subsystems 116 can perform different tasks of the DUT 102.

As an example, the DUT 102 can include a baseboard management controller (BMC) (the BMC is discussed further below). In other examples, the DUT 102 can be a different type of computing device, including a microprocessor, a microcontroller, a DSP, a circuit board, and so forth.

The configuration information memory 112 can be a memory that is separate from another memory in the programmable device 104, or the configuration information memory 112 can be a portion of a larger memory in the programmable device 104.

The programmable device 104 includes a data input 118 that is to receive configuration information for storing in the configuration information memory 112. The configuration information that can be supplied through the data input 118 to the configuration information memory 112 can be in the form of test profiles 119. In some examples, a "test profile" can include a collection of test vectors (a single test vector or multiple test vectors). A test vector can include program code and configuration parameter data to program a respective test logic block of the test logic 114. The test vector can include any or some combination of the following: configuration parameter data to set up a counter and/or a test monitor of a test logic block, configuration parameter data to establish a trigger condition that causes triggering of an action in response to occurrence of an event, configuration parameter data to set up an internal logic analyzer of a test logic block, such as to set a buffer depth (depth of a buffer to store captured measurement data) and other characteristics, and so forth.

In some examples, the program code and configuration parameter data can be in the form of address-data pairs, where data at respective addresses can be written to corresponding locations in each test logic block. For example, a test logic block can include an array of storage elements associated with respective addresses at which respective data can be written.

A test profile 119 can be in the form of a script, a file, a message, input from a command line interface, and so forth.

Configuration information (such as in the form of the test profiles 119) received at the data input 118 can be written to the configuration information memory 112, such as by a programmable device (PD) test controller 124 in the programmable device 104. As used here, a "controller" can refer to a hardware processing circuitry or can refer to machine-readable instructions executable on a hardware processing circuitry. The PD test controller 124 is to control the test mode of the DUT 102 and to transmit configuration information over the communication link 108 to the DUT 102 during a time that the DUT 102 is held in reset (discussed further below).

In some examples, the test profiles 119 can be provided to the programmable device 104, such as by a user or another entity (e.g., a program or machine), as part of initiating the test mode of the DUT 102. Such test profiles 119 can specify the tests that are to be performed at the DUT 102 for the test mode.

In other examples, the test profiles 119 may be previously provided to the programmable device 104 and stored in the configuration information memory 112 (which can be a persistent memory in such examples). The PD test controller 124 can select one or more test profiles (or test vectors) from among the pre-stored test profiles 119 to use in the test mode of the DUT 102. The selection can be based on an input received at the programmable device 104 from a user or another entity.

The programmable device 104 also includes a test mode input 120 that is connected to receive a test mode activation indicator. In some examples, the test mode activation indicator can be provided by a switch 122 that is external of the programmable device 104, or that can be part of the programmable device 104. A user can set the switch 122 in one of multiple positions. In a first position, the switch 122 provides an indicator to the programmable device 104 to indicate that the programmable device 104 is to operate in an operational mode, where "operational mode" can refer to a non-test mode in which testing of the DUT 102 is not activated. The operational mode includes normal tasks performed by the programmable device 104 under control of programmable device logic 128 in the programmable device 104, including any of the foregoing example tasks of the programmable device 104 listed further above. The programmable device logic 128 can be implemented with hardware processing circuitry and/or machine-readable instructions.

When set to a second position that is different from the first position, the switch 122 provides the test mode activation indicator through the test mode input 120, to cause the programmable device 104 to activate a test mode. The test mode activation indicator received through the test mode input 120 can be received by the PD test controller 124.

In other examples, instead of the switch 122, other mechanisms can be used to provide the test mode activation indicator through the test mode input 120. For example, a signal can be supplied from another device, a message can be sent to the programmable device 104, and so forth. In yet other examples, the test mode activation indicator can be programmed in the programmable device 104 as part of a reprogramming of the programmable device 104 (e.g., a special "debug build" of the programmable device 104).

The programmable device 104 includes a multiplexer 126 that can select between an output provided by programmable device logic 128 and an output provided by the test controller 124. Note that the multiplexer 126 can be implemented as a hardware multiplexer, or can be implemented using machine-readable instructions. The multiplexer 126 supports bidirectional communication between the 0 and 1 inputs of the multiplexer 126 and an output of the multiplexer 126. The output of the multiplexer 126 is connected to the communication interface 106.

The test controller 124 outputs a test mode indicator 130 (e.g., a signal). When the test mode indicator 130 is active, that indicates that the test mode has been selected based on the test mode activation indicator received at the test mode input 120. However, if the test mode indicator 130 is inactive, that means that the test mode has not been activated. If the test mode has been activated, the test mode indicator 130 is active and causes selection of the 1 input of the multiplexer 126 to cause data provided by the PD test controller 124 over a first signal path 125-1 to be passed through the multiplexer 126 to the output of the multiplexer 126. On the other hand, if the test mode has not been activated, the test mode indicator 130 is inactive and causes selection of the 0 input of the multiplexer 126 to cause data provided by the programmable device logic 128 over a second signal path 125-2 to be passed through the multiplexer 126 to the output of the multiplexer 126.

In the reverse direction from the communication interface 106, the multiplexer 126 can behave as a demultiplexer, in which data received at the output of the demultiplexer is passed to the 0 or 1 input depending upon the state of the test mode indicator 130.

The communication interface 106 can transmit data output by the multiplexer 126 over the communication link 108 to the DUT 102. When the test mode indicator 130 is active, the data output by the PD test controller 124 (which can include configuration information for configuring the test logic 114 of the DUT 102) is passed by the multiplexer 126 to the communication interface 106, which sends the configuration information to the DUT 102.

The communication interface 106 can also transmit a test mode indicator 150 to the DUT 102. The test mode indicator 150 can have a same state as the test mode indicator 130 (i.e., when the test mode indicator 130 is active the test mode indicator 150 is also active, and when the test mode indicator 130 is inactive the test mode indicator 150 is also inactive).

The communication interface 106 can also transmit a power good reset indicator 152 (e.g., a power good reset signal) to the DUT 102. The power good reset indicator 152 when inactive maintains the DUT 102 in reset. The power good reset indicator 152 when inactive indicates that a power supply voltage (e.g., a system power voltage 154) is off or has not yet reached a target voltage level. The system power voltage 154 can be generated by a power supply (not shown) of the system 100.

The power good reset indicator 152 when active indicates that the system power voltage 154 to the DUT 102 has reached the target voltage level, so that the DUT 102 can use the system power voltage 154 to perform operations.

The programmable device 104 is run on a different power supply voltage, referred to as an auxiliary power voltage 155. The auxiliary power voltage 155 can be provided by the same power supply as for the system power voltage 154, or a different power supply. The auxiliary power voltage 155 can be active while the system power voltage 154 is off, so that the programmable device 104 can execute various tasks when the DUT 102 is not operational. For example, the programmable device 104 run on the auxiliary power voltage 155 can receive the test mode activation indicator at the test mode input 120, and the PD test controller 124 can load configuration information into the configuration information memory 112 or can select a subset of the configuration information stored in the configuration information memory 112.

By running on the auxiliary power voltage 155 that is active in the system 100 before the system power voltage 154, the programmable device 104 can prepare for the test mode of the DUT 102 before the DUT 102 is allowed to exit reset. "Preparing" for the test mode can include receiving the test mode activation indicator and receiving or selecting configuration information to supply to the DUT 102.

In other examples, both the programmable device 104 and the DUT 102 are run on the same power supply voltage (e.g., the system power voltage 154), with the programmable device 104 being able to keep the DUT 102 non-operational (e.g., by keeping the power good reset indicator 152 inactive) while the programmable device 104 prepares for the test mode of the DUT 102.

Figure 2:
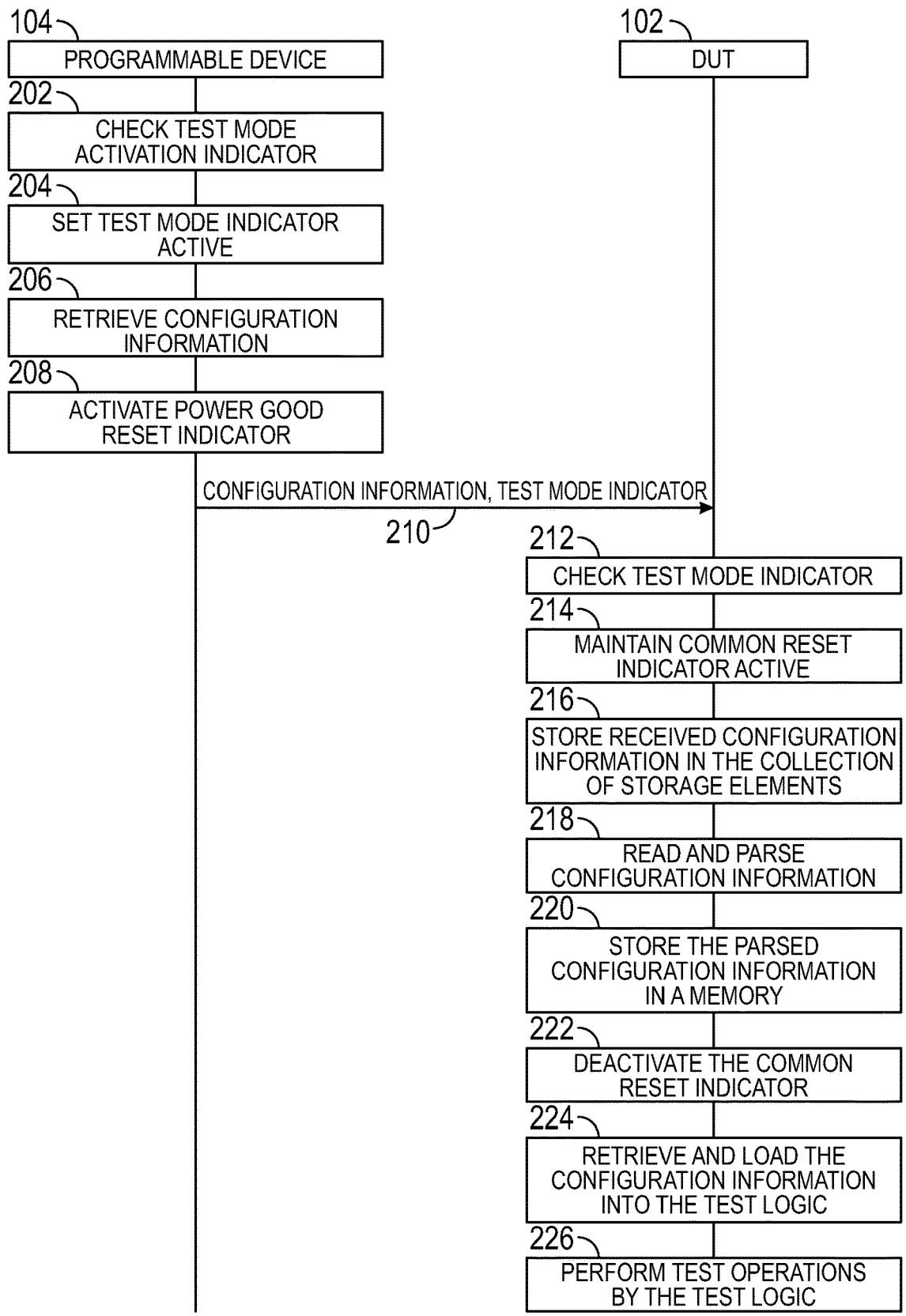
FIG. 2 is a flow diagram of a process according to some examples.

The ensuing discussion refers to both FIG. 1 and FIG. 2. FIG. 2 is a flow diagram of processes performed by the programmable device 104 and the DUT 102.

When the programmable device 104 initially starts (e.g., the auxiliary power voltage 155 initially supplies power to the programmable device 104), the PD test controller 124 checks (at 202) whether the test mode activation indicator received at the test mode input 120 is active. If so, the PD test controller 124 sets (at 204) the test mode indicator 130 active and retrieves (at 206) configuration information from the configuration information memory 112.

At some point, the programmable device 104 receives an indication that the system power voltage 154 to the DUT 102 is stable. In response, the programmable device 104 activates (at 208) the power good reset indicator 152 to the DUT 102, to allow the DUT 102 to exit reset. Also, the PD test controller 124 outputs (at 210) the configuration information through the multiplexer 126 to the communication interface 106, which transmits the configuration information to the DUT 102 over the communication link 108. At this time, since the test mode indicator 130 from the PD test controller 124 is active, the communication interface 106 also outputs (at 210) the test mode indicator 150 that is active to the DUT 102.

The configuration information and the test mode indicator 150 output by the programmable device 104 are received by the communication interface 110 of the DUT 102.

In some examples, the DUT 102 includes two reset domains: an early reset domain 160 and a common reset domain 162. If the test mode is active, the early reset domain 160 and the common reset domain 162 can exit reset independently of one another; more specifically, if the test mode is active, the early reset domain 160 can exit reset earlier than the common reset domain 162. On the other hand, if the test mode is inactive, then the early reset domain 160 and the common reset domain 162 collapse into one reset domain and can exit reset together.

The common reset domain 162 includes the subsystems 116 of the DUT 102 that are to be tested by the test logic 114, and DUT logic 164 of the DUT 102. The DUT logic 164 can be implemented with hardware processing circuitry and/or machine-readable instructions. The DUT logic 164 can perform tasks of the DUT 102. For example, if the DUT 102 is a BMC, then the DUT logic 164 can perform tasks of the BMC (discussed further below). If the DUT 102 is another type of computing device, then the DUT logic 164 can perform tasks of such other type of computing device.

The early reset domain 160 includes the test logic 114, the communication interface 110, a DUT test controller 170, a collection of storage elements 172, and other components (discussed further below).

A test mode indicator 156 in the DUT 102 is provided by the communication interface 110 and has the same state as the test mode indicator 150 received by the communication interface 110 of the DUT 102 from the programmable device 104. If the test mode indicator 156 is active (i.e., the test mode indicator 150 is active), then the early reset domain 160 can exit reset earlier than the common reset domain 162.

When the power good reset indicator 152 transitions from an inactive state to an active state (which indicates that the system power voltage 154 has reached the target voltage level and is stable), then the components in the early reset domain 160 of the DUT 102 can exit reset. When the DUT test controller 170 exits reset, the DUT test controller 170 checks (at 212) the state of the test mode indicator 156 from the communication interface 110. If the DUT test controller 170 detects that the test mode indicator 156 is active, the DUT test controller 170 maintains (at 214) a common reset indicator 166 active to keep the common reset domain 162 in reset. Keeping the common reset domain 162 in reset allows the components of the early reset domain 160 to receive the configuration information for configuring the test logic 114.

The configuration information transmitted by the programmable device 104 over the communication link 108 and received by the communication interface 110 is stored (at 216) into the collection of storage elements 172. In some examples, the collection of storage elements 172 can include shift registers into which bits of the configuration information are shifted as the configuration information is received over the communication link 108.

The DUT test controller 170 can read and parse (at 218) the configuration information that is shifted into the shift registers, as the configuration information is received. In some examples, the parsing of the configuration information can include translating the configuration information from a first format (as received from the programmable device 104) into a second format, such as in the form of a packet or message. The packet or message may include the following pieces: [Header][Packet Payload][CRC][Footer]. The header can include header information describing what is in the packet payload. For example, the header information may specify that the packet payload includes configuration information for configuring the test logic 114 of the DUT 102. The CRC includes cyclic redundancy check (CRC) information, which includes an error detection code to detect and possibly correct certain data errors in the packet payload. The CRC information can be used to confirm that the configuration information is error free (e.g., no error was introduced by the transmission of the configuration information from the programmable device 104 to the DUT 102, and/or no error was introduced when constructing (e.g., formatting) the packet or message containing the configuration information). The footer can include an indicator of the end of the packet or message.

In other examples, the DUT test controller 170 can pass the configuration information retrieved from the collection of storage elements 172 into other formats such that the parsed configuration information is ready for loading into the test logic 114 to configure the test logic 114.

The DUT test controller 170 can store (at 220) the parsed configuration information in a memory (not shown) that is part of the DUT test controller 170 or that is connected to the DUT test controller 170.

After the DUT test controller 170 has parsed the received configuration information, the DUT test controller 170 can deactivate (at 222) the common reset indicator 166 provided to the common reset domain 162 so that the components (including the subsystems 116 to be tested and the DUT logic 164) of the common reset domain 162 can exit reset.

In response to the DUT test controller 170 deactivating the common reset indicator 166, the test logic 114 can, in an autonomous manner, retrieve and load (at 224) the parsed configuration information produced by the DUT test controller 170. The test logic 114 retrieving and loading the parsed configuration information in the autonomous manner can refer to the test logic 114 performing the retrieving and the loading without an explicit control input from a user or another entity. Loading the parsed configuration information into the test logic 114 causes the test logic 114 to perform (at 226) test operations on subsystem(s) 116.

The test operations performed by the test logic 114 on each subsystem 116 can include various test measurements, including sampling target input signals and/or output signals of the subsystem 116, acquiring indications of occurrences of trigger conditions that cause the test logic 114 to perform signal sampling, sampling of clock signals, capturing a buffer size of a buffer used to store data of the subsystem 116, and so forth.

The test measurements of the subsystems 116 may occur over signal paths 188 in FIG. 1. The test measurements can be stored by the test logic 114 in a memory (not shown) of the DUT 102. The test measurements in the memory may be accessible through a TAP of the communication interface 110, according to the JTAG protocol. FIG. 1 shows a JTAG/TAP link 190 that can be used by an external device (e.g., a user device that is external of the system 100) to access the test measurements stored in the DUT 102. In other examples, the test measurements can be accessible in a different way by an external device.

In addition to test measurements, the test logic 114 can also perform various test actions, such as to trigger a subsystem 116 to perform certain test actions.

In some examples, since the components of the early reset domain 160 exit reset before the common reset domain 162, a clock signal can be generated locally in the early reset domain 160. As shown in FIG. 1, a test clock source 180 is included in the early reset domain 160. The test clock source 180 can generate a test clock signal for use in the early reset domain 160 while the common reset domain 162 is maintained in reset by the activated common reset indicator 166.

A clock multiplexer 182 is able to select between the test clock signal generated by the test clock source 180 and a system clock signal 184 produced by a clock source in the DUT logic 164. The system clock signal 184 is provided to the 0 input of the clock multiplexer 182, and the test clock signal is provided to the 1 input of the clock multiplexer 182. In some examples, the test clock signal generated by the test clock source 180 is a slower clock (runs at a lower frequency) than the system clock signal 184.

The select input of the clock multiplexer 182 to select between the 0 and 1 inputs is controlled by the logical AND of the test mode indicator 156 and the common reset indicator 166. If both the test mode indicator 156 is active and the common reset indicator 166 is active (indicating that the test mode of the DUT 102 is active and the common reset domain 162 is maintained in reset), then the 1 input is selected, and the clock multiplexer 182 passes the test clock signal at the 1 input to the output of the clock multiplexer 182. The output of the clock multiplexer 182 provides a clock signal 186 that is used by the DUT test controller 170, the collection of storage elements 172, the communication interface 110, and the test logic 114. This allows the DUT test controller 170, the collection of storage elements 172, the communication interface 110, and the test logic 114 to remain in synchronous relation with one another while the common reset domain 162 remains in reset.

On the other hand, if either the test mode indicator 156 is inactive (the DUT 102 is not in test mode) or the common reset indicator 166 is inactive (the DUT test controller 170 has allowed the common reset domain 162 to exit reset), the 0 input of the clock multiplexer 182 is selected, and the clock multiplexer 182 passes the system clock signal 184 at the 0 input to the output of the clock multiplexer 182 (which provides the clock signal 186).

Figure 3:
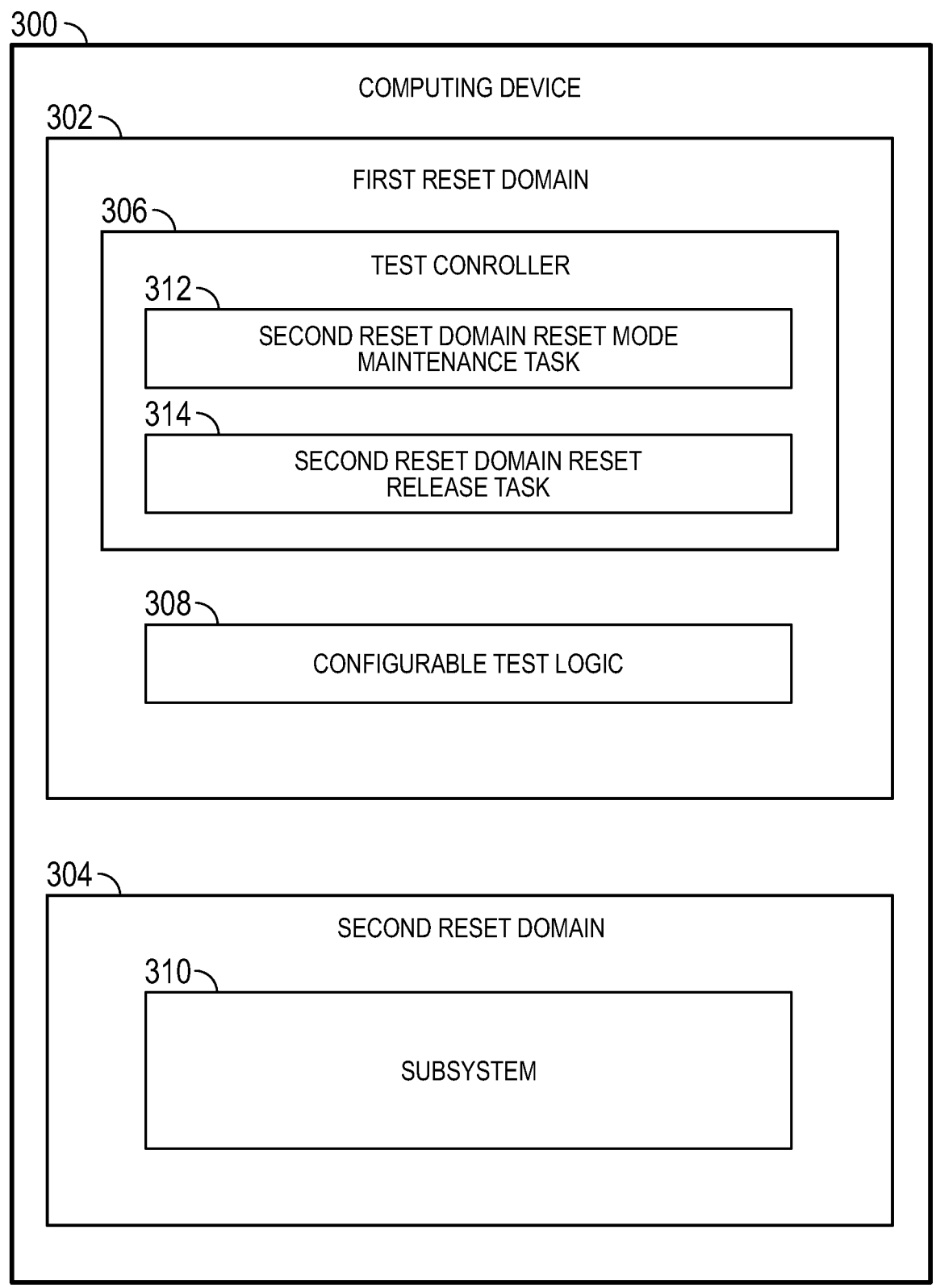
FIG. 3 is a block diagram of a computing device according to some examples.

FIG. 3 is a block diagram of a computing device 300 according to some examples. The computing device 300 can be the DUT 102 of FIG. 1, for example.

The computing device 300 includes a first reset domain 302 and a second reset domain 304 (similar to the reset domains 160 and 162, respectively, of FIG. 1).

The first reset domain 302 includes a test controller 306 (similar to the DUT test controller 170 of FIG. 1) and a configurable test logic 308 (similar to the test logic 114 of FIG. 1).

The second reset domain 304 includes a subsystem 310 to be measured by the configurable test logic 308. The subsystem 310 is similar to the subsystem 116 of FIG. 1.

The first reset domain 302 enters a reset mode (such as due to the power good reset indicator 152 of FIG. 1 being in an inactive state). After exiting the reset mode (e.g., due to the power good reset indicator 152 of FIG. 1 transitioning from the inactive state to an active state), the first reset domain 302 receives configuration information that configures the configurable test logic 308.

The test controller 306 of the first reset domain 302 can perform the following tasks. The tasks of the test controller 306 include a second reset domain reset mode maintenance task 312 to maintain the second reset domain 304 in a reset mode after the first reset domain 302 has exited the reset mode of the first reset domain 302.

The tasks of the test controller 306 include a second reset domain reset release task 314 to, responsive to the received configuration information for configuring the configurable test logic 308, provide a reset release indication to the second reset domain 304 to allow the second reset domain 304 to exit the reset mode of the second reset domain 304.

In some examples, the computing device 300 includes an interface (e.g., 110 in FIG. 1) to receive a power-on reset indication and the configuration information from a programmable device (e.g., 104 in FIG. 1). The power-on reset indication is to cause the computing device to enter the reset mode of the first reset domain 302. For example, the power-on reset indication can be the power good reset indicator 152 (FIG. 1) being inactive.

In some examples, the interface receives, from the programmable device, a test mode indication (e.g., the test mode indicator 150 of FIG. 1 being active) to indicate that the computing device 300 is to enter a test mode in which the configurable test logic 308 is to measure the subsystem 310. The programmable device controls, responsive to an input (e.g., 120 in FIG. 1) received at the programmable device, entry of the computing device into the test mode.

In some examples, a release of the computing device from reset is controlled by the programmable device, and the configuration information provided by the programmable device to the computing device is selected at the programmable device from a larger collection of configuration information (e.g., stored in the configuration information memory 112).

In some examples, power to the computing device 300 is controlled by the programmable device, and the programmable device is to select the test mode and the configuration information prior to the first reset domain 302 of the computing device 300 exiting the reset mode of the first reset domain 302.

In some examples, in the test mode the second reset domain 304 is to exit the reset mode of the second reset domain 304 independently of the first reset domain 302 exiting the reset mode of the first reset domain 302.

In some examples, in an absence of the test mode indication the computing device 300 is to enter an operational mode in which the first reset domain 302 and the second reset domain 304 are to exit reset together.

In some examples, the first reset domain 302 further includes a collection of storage elements (e.g., 172 in FIG. 1) to store the configuration information. The test controller 306 parses the configuration information in the collection of storage elements. After the parsing, the configurable test logic 308 loads the configuration information in an autonomous manner upon the release indication being provided to the second reset domain 304 by the test controller 306 (e.g., the common reset indicator 166 being set inactive).

In some examples, the first reset domain 302 includes a first clock source (e.g., 180 in FIG. 1) to produce a first clock for the test controller 306 while components within the second reset domain 304 remain in the reset mode of the second reset domain 304.

In some examples, the second reset domain 304 includes a second clock source to produce a second clock for the test controller 306 after the second reset domain has exited the reset mode of the second reset domain 304.

In some examples, the computing device 300 includes a clock multiplexer (e.g., 182 in FIG. 1) having a first input connected to the first clock, and a second input connected to the second clock, where the clock multiplexer selects the first clock or the second clock based on a signal which the test controller 306 derives based on whether the computing is in a test mode and whether the second reset domain 304 has been released from reset (e.g., the signal is a logical AND of the test mode indicator 156 and the common reset indicator 166 of FIG. 1).

Figure 4:
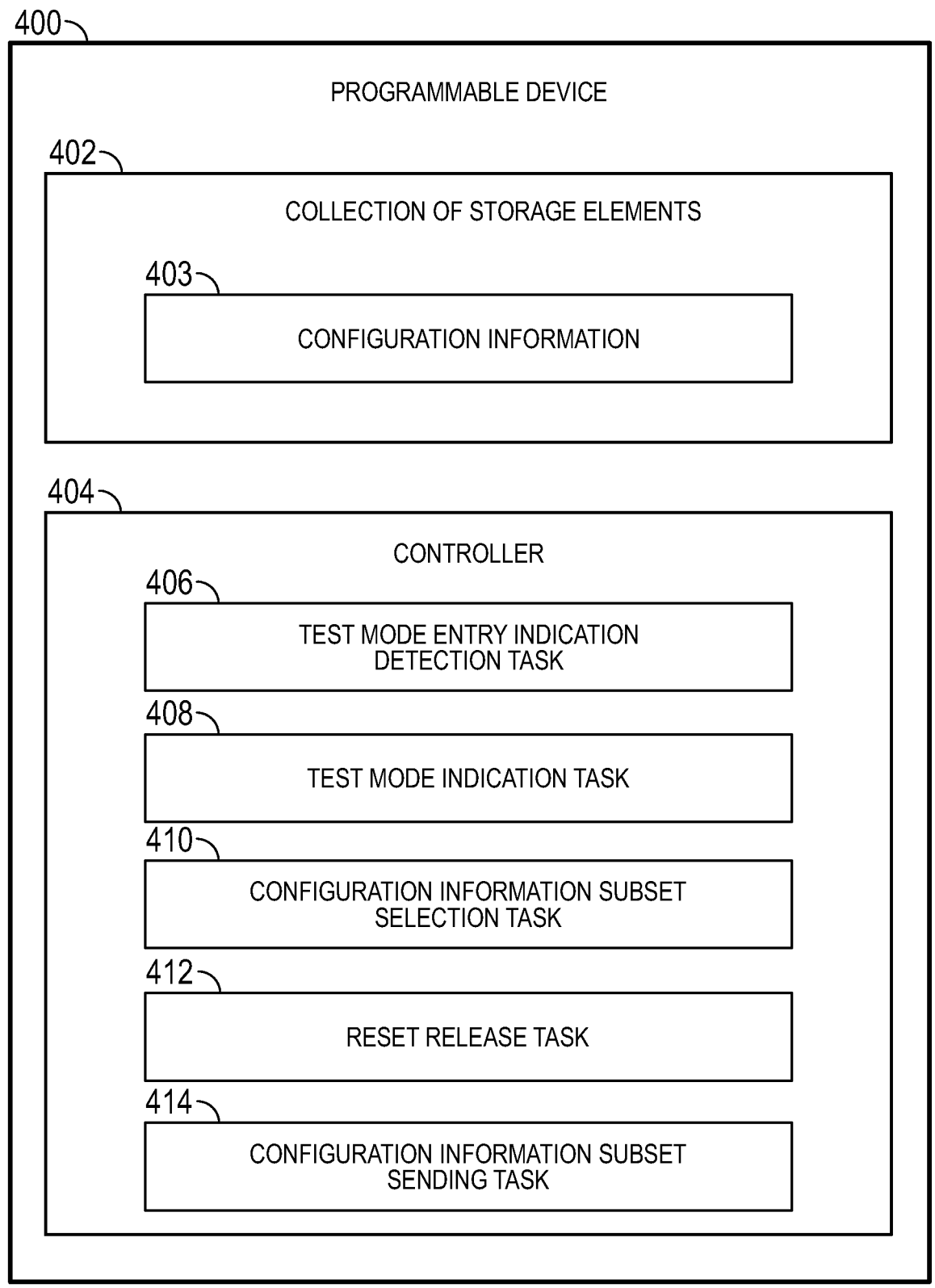
FIG. 4 is a block diagram of a programmable device according to some examples.

FIG. 4 is a block diagram of a programmable device 400, which is similar to the programmable device 104 of FIG. 1. The programmable device 400 includes a collection of storage elements 402 (e.g., similar to the configuration information memory 112 of FIG. 1) to store configuration information 403 for configuring a configurable test logic of a computing device (e.g., the DUT 102 of FIG. 1) that is separate from the programmable device 400.

The programmable device 400 includes a controller 404 (e.g., similar to the PD test controller 124 of FIG. 1) to perform various tasks. The tasks of the controller 404 include a test mode entry indication detection task 406 to, while the computing device is held in reset, detect an indication to enter a test mode. This can be based on the test mode activation indicator from the switch 122 received at the test mode input 120 of FIG. 1, for example. Alternatively, the indication to enter the test mode can be based on a programming of the programmable device 400.

The tasks of the controller 404 include a test mode indication task 408 to indicate to the computing device that the computing device is to enter the test mode. For example, the test mode indication can be the test mode indicator 150 sent from the programmable device 104 to the DUT 102 of FIG. 1.

The tasks of the controller 404 include a configuration information subset selection task 410 to select a subset of the configuration information from the collection of storage elements 402. The selected subset can be based on what test operations are desired (e.g., which target subsystems of multiple subsystems of the computing device are to be measured). The configuration information subset selected can be the configuration information for testing the target subsystems in the computing device.

The tasks of the controller 404 include a reset release task 412 to send an indication to the computing device to cause release of the computing device from reset. The indication to cause release from reset can be the power good reset indicator 152 of FIG. 1 being set active.

The tasks of the controller 404 include a configuration information subset sending task 414 to send the subset of the configuration information through an interface to the computing device, to cause loading of the subset of the configuration information into a collection of computing device storage elements that is part of a first reset domain of the computing device when the computing device is released from reset, the first reset domain of the computing device being independent of a second reset domain when the computing device is in the test mode, and the subset of the configuration information loaded into the collection of computing device storage elements for use in configuring the configurable test logic of the computing device to perform a test measurement of a subsystem in the second reset domain of the computing device.

Figure 5:
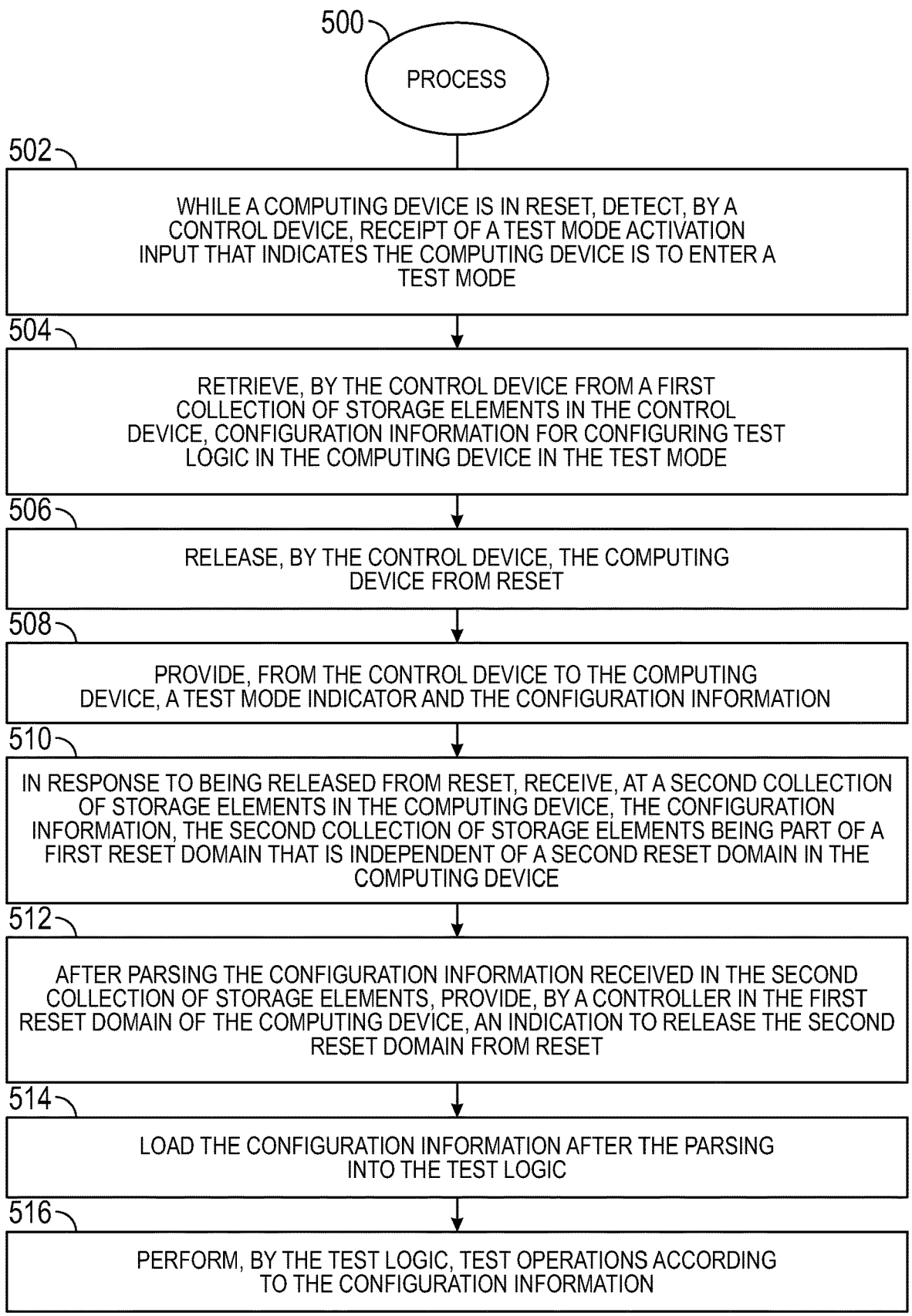
FIG. 5 is a flow diagram of a process according to some examples.

FIG. 5 is a flow diagram of a process 500 according to some examples. The process 500 includes, while a computing device is in reset, detecting (at 502), by a programmable device, receipt of a test mode activation input that indicates the computing device is to enter a test mode. For example, the test mode activation input can be received at the test mode input 120 of FIG. 1.

The process 500 includes retrieving (at 504), by the programmable device from a first collection of storage elements in the programmable device, configuration information for configuring test logic in the computing device in the test mode. The configuration information may be loaded into the first collection of storage elements as part of initiating the test mode of the computing device. Alternatively, the configuration information may have been previously stored in the first collection of storage elements.

The process 500 includes releasing (at 506), by the programmable device, the computing device from reset.

This can be accomplished by transitioning the power good reset indicator 152 (FIG. 1) from an inactive state to an active state, for example.

The process 500 includes providing (at 508), from the programmable device to the computing device, a test mode indicator and the configuration information. The test mode indicator can be the test mode indicator 150 of FIG. 1.

The process 500 includes, in response to being released from reset, receiving (at 510), at a second collection of storage elements in the computing device, the configuration information, the second collection of storage elements being part of a first reset domain that is independent of a second reset domain in the computing device.

The process 500 includes, after parsing the configuration information received in the second collection of storage elements, providing (at 512), by a controller in the first reset domain of the computing device, an indication to release the second reset domain from reset. The indication to release the second reset domain from reset can include setting the common reset indicator 166 (FIG. 1) to an inactive state.

The process 500 includes loading (at 514) the configuration information after the parsing into the test logic.

The process 500 includes performing (at 516), by the test logic, test operations according to the configuration information.

In the above discussion, reference is made to a BMC as being an example of the DUT 102 of FIG. 1. A "BMC" can refer to a specialized service controller that monitors the physical state of an electronic device using sensors and communicates with a remote management system (that is remote from the electronic device) through an independent "out-of-band" connection. The BMC can perform management tasks to manage components of the electronic device. Examples of management tasks that can be performed by the BMC can include any or some combination of the following: power control to perform power management of the electronic device (such as to transition the electronic device between different power consumption states in response to detected events), thermal monitoring and control of the electronic device (such as to monitor temperatures of the electronic device and to control thermal management states of the electronic device), fan control of fans in the electronic device, system health monitoring based on monitoring measurement data from various sensors of the electronic device, remote access of the electronic device (to access the electronic device over a network, for example), remote reboot of the electronic device (to trigger the electronic device to reboot using a remote command), system setup and deployment of the electronic device, system security to implement security procedures in the electronic device, and so forth.

In some examples, the BMC can provide so-called "lights-out" functionality for an electronic device. The lights out functionality may allow a user, such as a systems administrator, to perform management operations on the electronic device even if an operating system (OS) is not installed or not functional on the electronic device.

Moreover, in some examples, the BMC can run on auxiliary power provided by an auxiliary power supply (e.g., a battery); as a result, the electronic device does not have to be powered on to allow the BMC to perform the BMC's operations. The auxiliary power supply is separate from a main power supply that supplies powers to other components (e.g., a main processor, a memory, an input/output (I/O) device, etc.) of the electronic device.

In examples where the DUT 102 of FIG. 1 is a BMC, then the subsystems 116 that can be tested can include a power control subsystem to perform power management, thermal monitoring and control subsystem, a fan control subsystem to control fans, and so forth.

In the present disclosure, use of the term "a," "an," or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A computing device comprising:
   a first reset domain comprising a test controller and a configurable test logic; and
   a second reset domain comprising a subsystem to be measured by the configurable test logic, wherein the first reset domain is to:
   enter a reset mode, and
   after exiting the reset mode, receive configuration information that configures the configurable test logic,
   wherein the test controller of the first reset domain is to:
   maintain the second reset domain in a reset mode after the first reset domain has exited the reset mode of the first reset domain, and
   responsive to the received configuration information for configuring the configurable test logic, provide a reset release indication to the second reset domain to allow the second reset domain to exit the reset mode of the second reset domain.

2. The computing device of claim 1, comprising:
   an interface to receive a power-on reset indication and the configuration information from a control device, the power-on reset indication to cause the computing device to enter the reset mode of the first reset domain.

3. The computing device of claim 2, wherein the interface is to receive, from the control device, a test mode indication to indicate that the computing device is to enter a test mode in which the configurable test logic is to measure the subsystem, the control device to control, responsive to an input received at the control device, entry of the computing device into the test mode.

4. The computing device of claim 3, wherein a release of the computing device from reset is controlled by the control device, and the configuration information provided by the control device to the computing device is selected at the control device from a larger collection of configuration information.

5. The computing device of claim 4, wherein power to the computing device is controlled by the control device, and the control device is to select the test mode and the configuration information prior to the first reset domain of the computing device exiting the reset mode of the first reset domain.

6. The computing device of claim 3, wherein in the test mode the second reset domain is to exit the reset mode of the second reset domain independently of the first reset domain exiting the reset mode of the first reset domain.

7. The computing device of claim 6, wherein in an absence of the test mode indication the computing device is to enter an operational mode in which the first reset domain and the second reset domain are to exit reset together.

8. The computing device of claim 2, wherein the first reset domain further comprises a collection of storage elements to store the configuration information, and
wherein the test controller is to parse the configuration information in the collection of storage elements, and
wherein, after the parsing, the configurable test logic is to load the configuration information in an autonomous manner upon the reset release indication being provided to the second reset domain by the test controller.

9. The computing device of claim 8, wherein the configuration information comprises program code and associated configuration parameter data that when loaded to the configurable test logic configures the configurable test logic to perform a target test operation.

10. The computing device of claim 8, wherein the test controller is to parse the configuration information by translating the configuration information into a specified format.

11. The computing device of claim 8, wherein the test controller is to parse the configuration information by checking the configuration information for an error of transmission or construction.

12. The computing device of claim 1, wherein the first reset domain comprises a first clock source to produce a first clock for the test controller while components within the second reset domain remain in the reset mode of the second reset domain.

13. The computing device of claim 12, wherein the second reset domain comprises a second clock source to produce a second clock for the test controller after the second reset domain has exited the reset mode of the second reset domain.

14. The computing device of claim 13, comprising:
a clock multiplexer having a first input connected to the first clock, and a second input connected to the second clock, the clock multiplexer to select the first clock or the second clock based on a signal which the test controller derives based on whether the computing device is in a test mode.

15. A programmable device comprising:
a collection of storage elements to store configuration information for configuring a configurable test logic of a computing device that is separate from the programmable device;
a controller to:
while the computing device is held in reset, detect an indication to enter a test mode;
indicate to the computing device that the computing device is to enter the test mode;
select a subset of the configuration information from the collection of storage elements;
send an indication to the computing device to cause release of the computing device from reset; and
send the subset of the configuration information through an interface to the computing device, to cause loading of the subset of the configuration information into a collection of computing device storage elements that is part of a first reset domain of the computing device when the computing device is released from reset, the first reset domain of the computing device being independent of a second reset domain when the computing device is in the test mode, and the subset of the configuration information loaded into the collection of computing device storage elements for use in configuring the configurable test logic of the computing device to perform a test measurement of a subsystem in the second reset domain of the computing device.

16. The programmable device of claim 15, wherein the indication to cause release of the computing device from reset comprises an indicator that a power supply voltage to the computing device has reached a target voltage level.

17. A method comprising:
while a computing device is in reset, detecting, by a control device, receipt of a test mode activation input that indicates the computing device is to enter a test mode;
retrieving, by the control device from a first collection of storage elements in the control device, configuration information for configuring test logic in the computing device in the test mode;
releasing, by the control device, the computing device from reset;
providing, from the control device to the computing device, a test mode indicator and the configuration information;
in response to being released from reset, receiving, at a second collection of storage elements in the computing device, the configuration information, the second collection of storage elements being part of a first reset domain that is independent of a second reset domain in the computing device;
after parsing the configuration information received in the second collection of storage elements, providing, by a controller in the first reset domain of the computing device, an indication to release the second reset domain from reset;
loading the configuration information after the parsing into the test logic; and
performing, by the test logic, test operations according to the configuration information.

18. The method of claim 17, wherein when the second reset domain is in reset, a communication interface and the controller in the first reset domain are clocked by a clock signal generated by a clock source in the first reset domain.

19. The method of claim 18, wherein responsive to the indication to release the second reset domain from reset, the communication interface and the controller in the first reset domain are clocked by a clock signal generated by a clock source in the second reset domain.

20. The method of claim 18, wherein the test operations performed by the test logic are during a time interval that follows an exit of the computing device from reset.

* * * * *